(12) United States Patent
Nakamura et al.

(10) Patent No.: US 6,255,916 B1
(45) Date of Patent: Jul. 3, 2001

(54) RESONATOR-TYPE SURFACE-ACOUSTIC-WAVE FILTER FOR REDUCING THE SIGNAL STRENGTH OF A SPURIOUS PEAK

(75) Inventors: Yoshitaka Nakamura; Sumio Yamada; Sen Minemura, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1195 days.

(21) Appl. No.: 08/598,137

(22) Filed: Feb. 7, 1996

Related U.S. Application Data

(63) Continuation of application No. 08/214,311, filed on Mar. 17, 1994, now abandoned.

(30) Foreign Application Priority Data

May 27, 1993 (JP) ................................... 5-125775

(51) Int. Cl.⁷ ................................... H03H 9/64
(52) U.S. Cl. ................................... 333/195; 310/313 D
(58) Field of Search ................................... 333/193, 194, 333/195, 196; 310/313 R, 313 D, 313 B

(56) References Cited

U.S. PATENT DOCUMENTS

| | | | |
|---|---|---|---|
| 4,166,258 | 8/1979 | Tseng | 333/195 |
| 4,635,009 | 1/1987 | Ebata | 333/195 |
| 4,760,359 | 7/1988 | Shiba et al. | |
| 4,837,476 | * 6/1989 | Mochizuki | 333/195 |
| 4,954,793 | * 9/1990 | Misu et al. | 333/193 |
| 5,115,216 | * 5/1992 | Hikita et al. | 333/195 |
| 5,204,575 | * 4/1993 | Kanda et al. | 333/195 |

FOREIGN PATENT DOCUMENTS

| | | | |
|---|---|---|---|
| 0 186 410 | * 7/1986 | (EP) . | |
| 0530547 | * 3/1993 | (EP) | 333/195 |
| 05 41 284 | 5/1993 | (EP) . | |
| 2 078 042 | * 12/1981 | (GB) . | |
| 56-19765 | 5/1981 | (JP) . | |
| 57 99813 | 6/1982 | (JP) . | |
| 58-1850 | 1/1983 | (JP) . | |
| 61-142811 | * 6/1986 | (JP) . | |
| 63-88910 | 4/1988 | (JP) . | |
| 63-119310 | 5/1988 | (JP) . | |
| 119814 | * 1/1989 | (JP) . | |
| 64-3369 | 1/1989 | (JP) . | |
| 1-33969 | 7/1989 | (JP) . | |
| 1-231417 | 9/1989 | (JP) . | |
| 2-104120 | 4/1990 | (JP) . | |
| 2194714 | * 8/1990 | (JP) . | |

(List continued on next page.)

OTHER PUBLICATIONS

Extended New–Type Saw–Resonator–Coupled Filters Used in Duplexer For Japanese Cellular Radio, M. Hikita et al., Electronic Letters, Oct. 22, 1992, vol. 28, No. 22.*

"Suppression of Bulk–Scattering Loss in SAW Resonator with Quasi–Constant Acoustic Reflection Periodicity", Yasuo Ebata, *Ultrasonics Symposium*, (1988), pp. 91–96.

"Acoustic Surface Wave Resonators for Broadband Applications", J. Vandewege et al., pp. 663–667; Proceedings of the 8th European Microwave Conf; Paris, France; Sep. 8, 1978.

*Primary Examiner*—Benny Lee
(74) *Attorney, Agent, or Firm*—Staas & Halsey LLP

(57) ABSTRACT

An object of the present invention is to realize a resonator-type SAW filter permitting higher extra-passband suppressibility by minimizing occurrence of an unwanted spurious peak. A resonator-type SAW filter in which a plurality of SAW resonators each having reflectors and an interdigital transducer and being connected in series and parallel with the other, wherein in at least one of the SAW resonators, particularly in at least one of the SAW resonators connected in series with one another, an inter-electrode pitch $\lambda_{REF}$ in the reflectors has a different value from an inter-electrode pitch $\lambda_{IDT}$ in the interdigital transducers.

6 Claims, 10 Drawing Sheets

FOREIGN PATENT DOCUMENTS

| | | | |
|---|---|---|---|
| 0270416 | * 11/1990 | (JP) | ................................ 333/195 |
| 3-22702 | 1/1991 | (JP) . | |
| 3-22703 | 1/1991 | (JP) . | |
| 3-3412 | 1/1991 | (JP) . | |
| 334614 | * 2/1991 | (JP) . | |
| 380709 | * 4/1991 | (JP) . | |
| 3261210 | * 11/1991 | (JP) . | |
| 4-54011 | 2/1992 | (JP) . | |
| 4 94208 | 3/1992 | (JP) . | |
| 4-81823 | 3/1992 | (JP) . | |
| 4207615 | * 7/1992 | (JP) . | |
| 4259109 | * 9/1992 | (JP) . | |
| 4-275710 | 10/1992 | (JP) . | |
| 4408989 | * 12/1994 | (JP) . | |

* cited by examiner $\lambda_{REF}$  $\lambda_{IDT}$ $\lambda_{SREF} = 4.38 \mu m$ $\lambda_{SIDT} = 4.42 \mu m$ $\lambda_{SREF} = 4.40 \mu m$ $\lambda_{SREF} = 4.39 \mu m$ $\lambda_{SREF} = 4.38 \mu m$ $\lambda_{SREF} = \lambda_{SIDT}$ $\lambda_{SREF} \neq \lambda_{SIDT}$ $\lambda_{SIDT} < \lambda_{SREF} = \lambda_{PREF} < \lambda_{PIDT}$ $\lambda_{SREF}$ SMALLER $\lambda_{SREF} < \lambda_{SIDT}$

EQUAL $\lambda_{SREF} = \lambda_{SIDT}$ $\lambda_{SREF}$ LARGER $\lambda_{SREF} > \lambda_{SIDT}$

RESONATOR-TYPE SURFACE-ACOUSTIC-WAVE FILTER FOR REDUCING THE SIGNAL STRENGTH OF A SPURIOUS PEAK

This application is a continuation, of application Ser. No. 08/214,311, filed Mar. 17, 1994, now abandoned.

BACKGROUND OF THE INVENTION (1) Field of the Invention

The present invention relates to a band-pass resonator-type surface-acoustic-wave filter having a plurality of surface-acoustic-wave resonators connected in series and parallel with one another. More particularly, this invention is concerned with a resonator-type surface-acoustic-wave filter for reducing the signal height of a spurious peak that causes the extra-passband suppressibility to deteriorate and occurs especially at a frequency outside a passband.

(2) Description of the Related Art

A known high-frequency band pass filter includes a surface-acoustic-wave (SAW) resonator in which different electrode patterns are formed in reflectors and an InterDigital Transducer (IDT) on a piezoelectric element. With the recent popularity of mobile telephones and portable telephones, there is an increasing demand for SAW resonators as small, thin radio-frequency (RF) filters.

Generally, the SAW resonator element has a pair of reflectors each of which has a plurality of reflector electrodes arranged in the form of a grid on a substrate made of a piezoelectric material or a magnetostrictive material. An IDT having numerous pairs of screen-like electrodes is interposed between the two reflectors. Resonance resulting from reciprocation of a surface acoustic wave between the two reflectors is fed to an electric circuit via input/output terminals. The pitch between adjoining reflector electrodes, which is referred to as an inter-electrode pitch, in the reflectors shall be defined as $\lambda_{REF}$, and the pitch between adjoining interdigital electrodes in the IDT, which is referred to as an inter-electrode pitch, shall be defined as $\lambda_{IDT}$. The values of the inter-electrode pitches are determined according to a resonant frequency. In the prior art SAW resonator element, $\lambda_{REF}$ and $\lambda_{IDT}$ have an equal value.

A SAW filter that has been adopted widely to date has a transversal structure or what is referred to as a cascade structure in which transversal structures are cascaded in two stages. For example, Japanese Unexamined Patent Publication (Kokai) No.57-99813 has disclosed a transversal SAW filter, and Japanese Unexamined Patent Publication (Kokai) No.4-94208 has disclosed a cascaded SAW filter. In each of SAW filters shown in these documents, reflectors are arranged in both sides of an IDT.

A SAW resonator with a pair of terminals includes an equivalent circuit electrically equivalent to a crystal oscillator. As already known, a resonator-type filter can be realized by connecting the SAW resonators in series and parallel with one another in the form of a multistage structure. Therefore, the resonator-type filter is available in various modes dependent on connection arrangements. In a resonator-type filter based on SAW resonators, each SAW resonator having a pair of terminals is treated as a pure reactance element in order to utilize a resonant effect. Impedance occurring at any of frequencies in a passband can therefore be limited. This obviates the necessity of an external matching circuit and realizes a reduced insertion loss. The resonator-type filter acts as a narrow-band band pass filter because of the generally large capacity ratio among resonators. Owing to characteristics similar to those of a narrow-band band-pass filter, the resonator-type filter is used as an RF filter for a mobile telephone or a portable telephone.

Thus, the SAW resonator having a pair of terminals and the resonator-type filter based on the SAW resonators differ from each other even in terms of the design technology. The present invention relates to a resonator-type filter composed of SAW resonators each having a pair of terminals. Hereafter, the resonator-type filter composed of SAW resonators each having a pair of terminals is referred to as a resonator-type SAW filter.

The resonator-type SAW filter offers great freedom in specifying constants for an individual resonator in the process of design or in selecting a combination of resonators to be connected in series or parallel with one another. This leads to a low loss and a relatively large stop-band attenuation ratio. Thanks to these advantages, resonator-type SAW filters are taking the place of conventional filters.

One of the important characteristics of a band pass filter is stop-band suppressibility. The stop-band suppressibility indicates to what extent signals with frequencies outside a passband can be blocked relative to signals with frequencies within the passband. When a band pass filter is employed as an RF filter for radio communications, if the stop-band suppressibility is small, interference and other problems may occur. Therefore, a large stop-band suppressibility is usually desired.

In a conventional resonator-type SAW filter, a spike or what is referred to as a spurious peak occurs at a certain frequency outside a passband because of the structure of the filter. The spurious peak causes the stop-band suppressibility to drop or the attenuation ratio to rise like a spike. In equipment using the resonator-type SAW filter, when the frequency causing the spurious peak corresponds to a frequency that must be suppressed, the suppressibility deteriorates by a degree corresponding to the height of the spurious peak.

When a resonator-type SAW filter is needed, a resonator-type SAW filter permitting high suppressibility at all stop-band frequencies should be adopted on the assumption that stop-band suppressibility may deteriorate due to the spurious peak. In this case, occurrence of a spurious peak would pose no problem. Alternatively, a spurious peak is reduced in signal height by adjusting the combination of or the number of stages of SAW resonators each having a pair of terminals to be connected in series or parallel with one another. However, it is very hard to manufacture a resonator-type SAW filter permitting high suppressibility at all stop-band frequencies. Adjusting the combination of or the number of stages of SAW resonators each having a pair of terminals requires considerable labor and is quite time-consuming.

SUMMARY OF THE INVENTION

The present invention attempts to solve the aforesaid problems. An object of the present invention is to realized a resonator-type SAW filter permitting higher extra-passband suppressibility by minimizing the occurrence of an unwanted spurious peak.

In a resonator-type SAW filter according to the present invention, a plurality of SAW resonators each having a pair of terminals as well as reflectors and an IDT are connected in series and parallel with one another. In at least one of the SAW resonators, particularly in at least one of the SAW resonators having a pair of terminals and being connected in series with another, an inter-electrode pitch $\lambda_{REF}$ in the reflectors has a different value than inter-electrode pitch $\lambda_{IDT}$ in the IDTs.

In a resonator-type SAW filter in the second mode of the present invention, only in SAW resonators each having a pair of terminals and being connected in series with the other, is the inter-electrode pitch $\lambda_{SREF}$ in the reflectors a different value to the inter-electrode pitch $\lambda_{SIDT}$ in the IDT.

Further, in a resonator-type SAW filter in the third mode of the present invention, in all SAW resonators, the inter-electrode pitch $\lambda_{REF}$ in the reflectors is different value to the inter-electrode pitch $\lambda_{IDT}$ in the IDTs.

For a conventional resonator-type SAW filter, the inter-electrode pitch in the reflectors in each SAW resonator having a pair of terminals is set to the same value as the inter-electrode pitch in the IDT therein. In contrast, for a resonator-type SAW filter of the present invention, in at least one of SAW resonators, particularly, in at least one of SAW resonators each having a pair of terminals and being connected in series with the other, the inter-electrode pitch $\lambda_{REF}$ in the reflectors is set to a slightly different value from the inter-electrode pitch $\lambda_{IDT}$ in the IDTs. It has been found that this structure can reduce the height of a spurious peak. Moreover, as far as the difference is the smallest possible value which can reduce the height of a spurious peak, the difference hardly affects other characteristics including the intra-passband characteristic. A conventional design procedure can therefore be used.

In SAW resonators each having a pair of terminals and being connected in parallel with the other, when the inter-electrode pitch in the reflectors is set to a value different from the inter-electrode pitch in the IDTs, it becomes hard to provide the desired frequency characteristics. Only in SAW resonators each having a pair of terminals and being connected in series with the other, therefore, the inter-electrode pitches are set to different values. Under certain conditions, however, even if the inter-electrode pitches are set to different values in SAW resonators each having a pair of terminals and being connected in parallel with the other, the height of a spurious peak could be reduced without affecting other frequency characteristics.

The aforesaid Japanese Unexamined Patent Publication (Kokai) No.57-99813 has disclosed a transversal SAW filter in which an inter-electrode pitch in reflectors is made slightly shorter than an inter-electrode pitch in IDTs in an effort to optimize both sharpness of resonance and resonant resistance. However, this document discloses the SAW filter consisting of only one SAW resonator, but does not disclose the SAW filter consisting of a plurality of SAW resonators. Therefore, the SAW filter disclosed in the Japanese Unexamined Patent Publication (Kokai) No.57-99813 differs from the resonator-type SAW filter of the present invention even in terms of the design technology. In the resonator-type SAW filter, since the resonant resistance is sufficiently low, measures need not be taken to optimize both the sharpness of resonance and resonant resistance.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Before proceeding to a detailed description of the preferred embodiments of the present invention, a prior art resonator-type SAW filter and its problems will be described, with reference to the accompanying drawings relating thereto, for a clearer understanding of the differences between the prior art and the present invention.

Figure 1A:
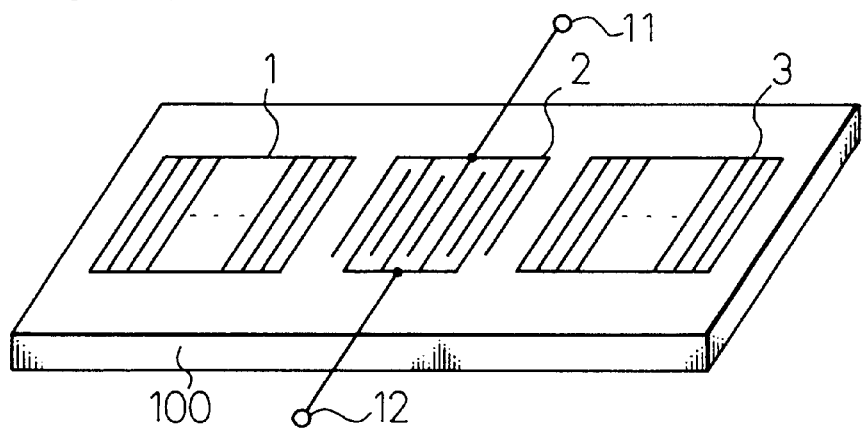
FIGS. 1A to 1C show a basic structure of a SAW resonator.
Figure 1B:
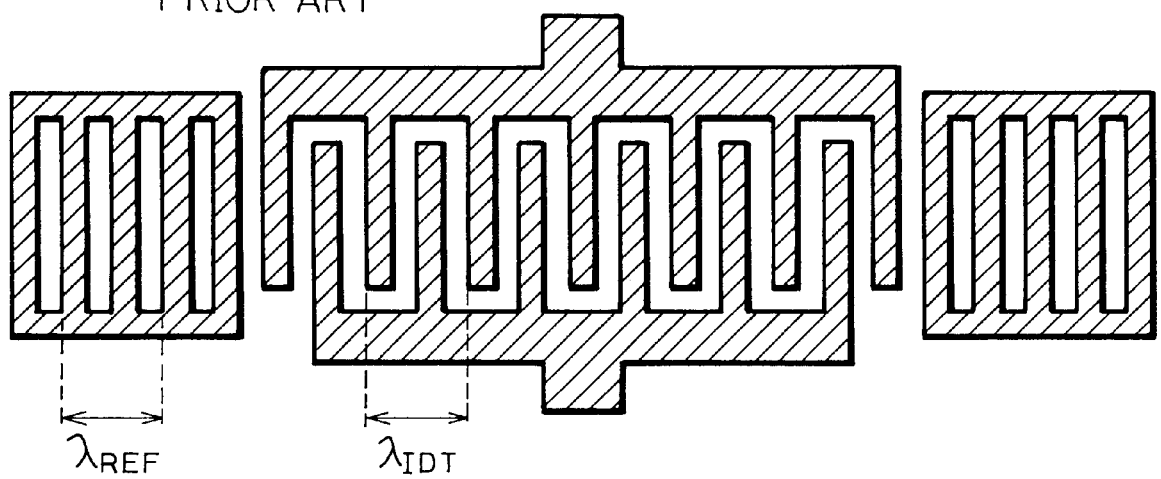
Figure 1C:
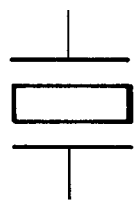

FIGS. 1A to 1C show a basic structure of a SAW resonator. FIG. 1A is an oblique view showing a SAW resonator element schematically. FIG. 1B shows an electrode pattern. FIG. 1C shows a symbol for a SAW resonator.

As shown in FIGS. 1A and 1B, a standard SAW resonator element has a pair of reflectors 1 and 3, each having a plurality of reflector electrodes arranged in the form of a grid on a substrate 100 made of a piezoelectric material. An IDT 2 having numerous pairs of screen-like electrodes is interposed between the reflectors 1 and 3. Resonance resulting from reciprocation of a surface acoustic wave between the reflectors 1 and 3 is fed to an electric circuit via input/output terminals 11 and 12. The pitch between adjoining reflector electrodes, which is referred to as an inter-electrode pitch, in the reflectors 1 and 3 shall be defined as $\lambda_{REF}$, and the pitch between adjoining interdigital electrodes, which is referred to as an inter-electrode pitch, in the IDT 2 shall be defined as $\lambda_{IDt}$. The values of the inter-electrode pitches are determined according to a resonant frequency. In the prior art SAW resonator element, $\lambda_{REF}$ and $\lambda_{IDT}$ have an equal value.

The foregoing SAW resonator element is usually expressed with a symbol shown in FIG. 1C.

Figure 2A:
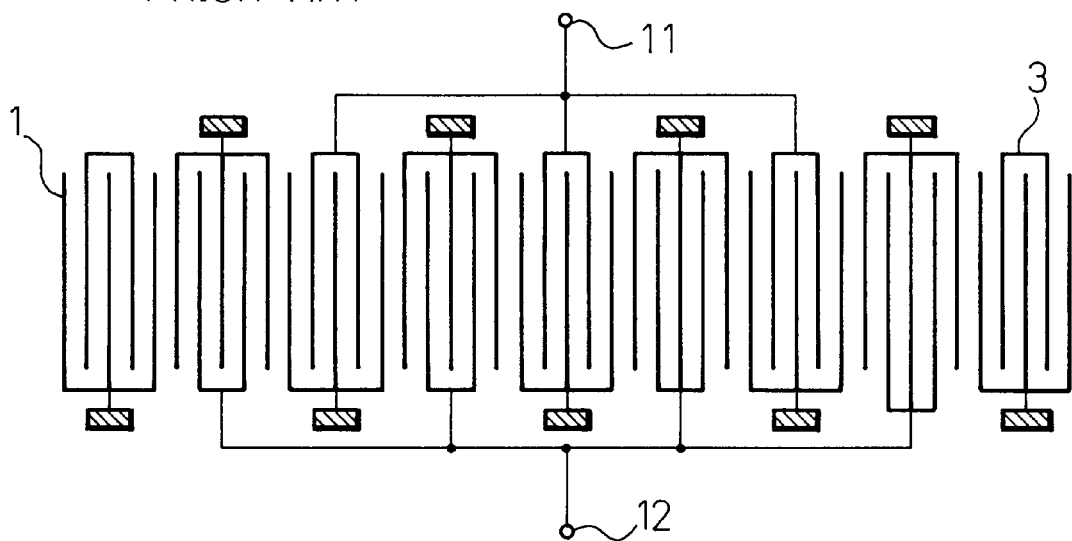
FIGS. 2A and 2B respectively show the structures of two types of conventional SAW resonators.
Figure 2B:
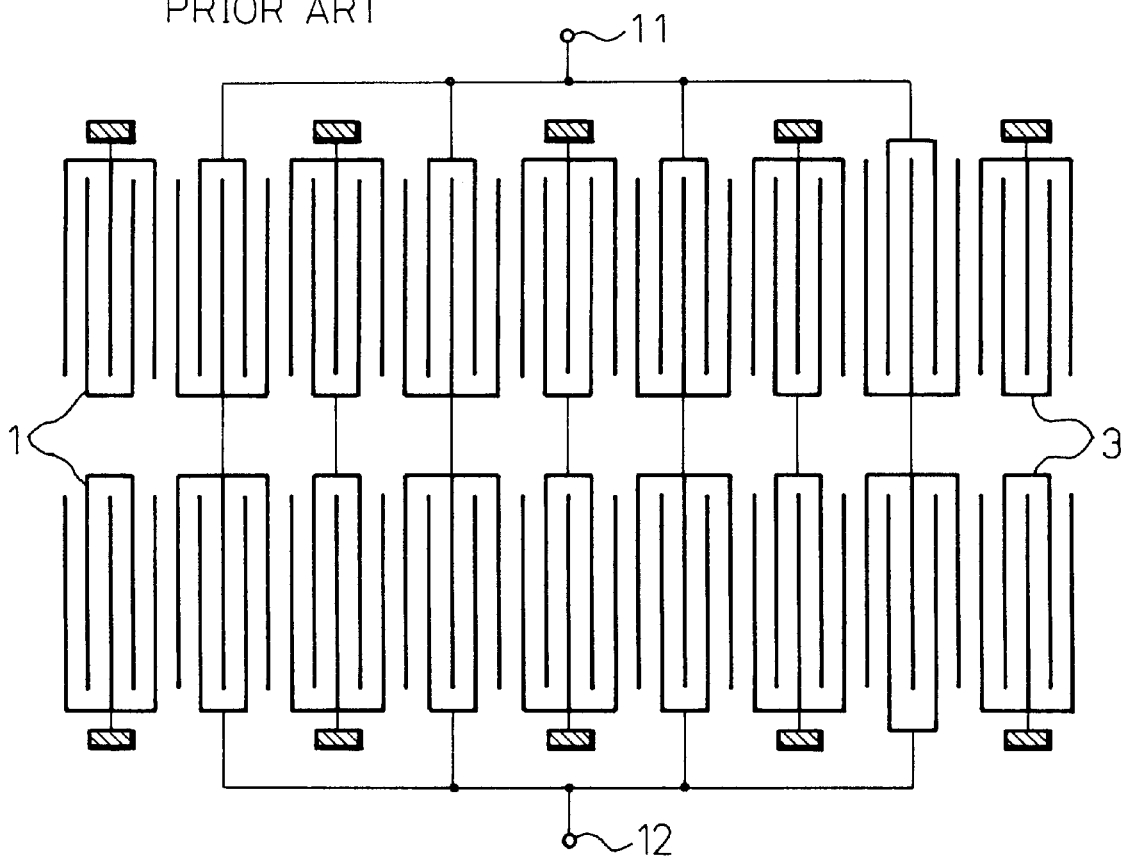

A SAW filter that has been adopted widely to date has a transversal structure or what is referred to as a cascade structure in which transversal structures are cascaded in two stages. FIGS. 2A and 2B show examples of electrode patterns for a conventional SAW filter. FIG. 2A shows a transversal electrode pattern. FIG. 2B shows a cascaded electrode pattern. References 1 and 3 on both sides of FIG. 2A or 2B denote reflectors. An IDT is located in the center. As illustrated, grounded electrodes are arranged alternately. For the sake of illustration, the number of electrodes is not so large. In reality, quite a large number of electrodes are arranged on the substrate.

Figure 3A:
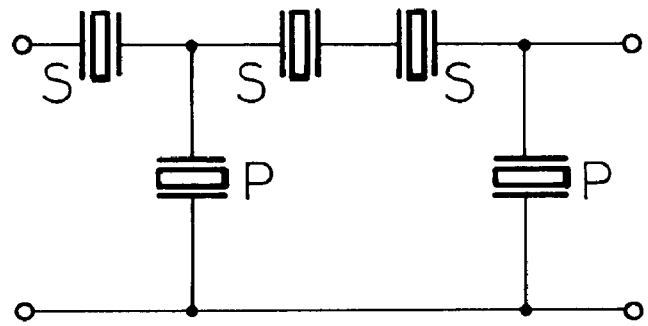
FIGS. 3A to 3C show examples of a connection arrangement for a resonator-type SAW filter.
Figure 3B:
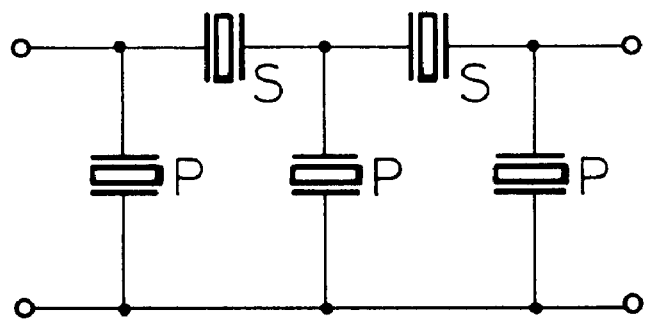
Figure 3C:
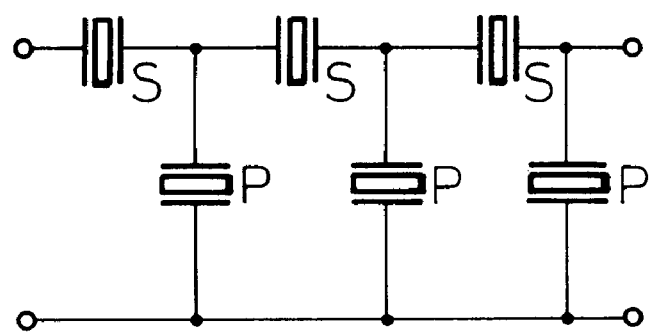

A SAW resonator with a pair of terminals includes an equivalent circuit electrically equivalent to a crystal oscillator. As already known, a resonator-type filter can be realized by connecting SAW resonators in series and parallel with one another in the form of a multistage structure. FIGS. 3A to 3C show examples of connection arrangements for SAW resonators having a pair of terminals in a resonator-type SAW filter. Reference S denotes a SAW resonator having a pair of terminals and being connected in series with the other. Reference P denotes a SAW resonator having a pair of terminals and being connected in parallel with the other. FIG. 3A shows an SPSSP arrangement. FIG. 3B shows a PSPSP arrangement. FIG. 3C shows an SPSPSP arrangement. Thus, the resonator-type filter is available in various modes dependent on connection arrangements.

Figure 4:
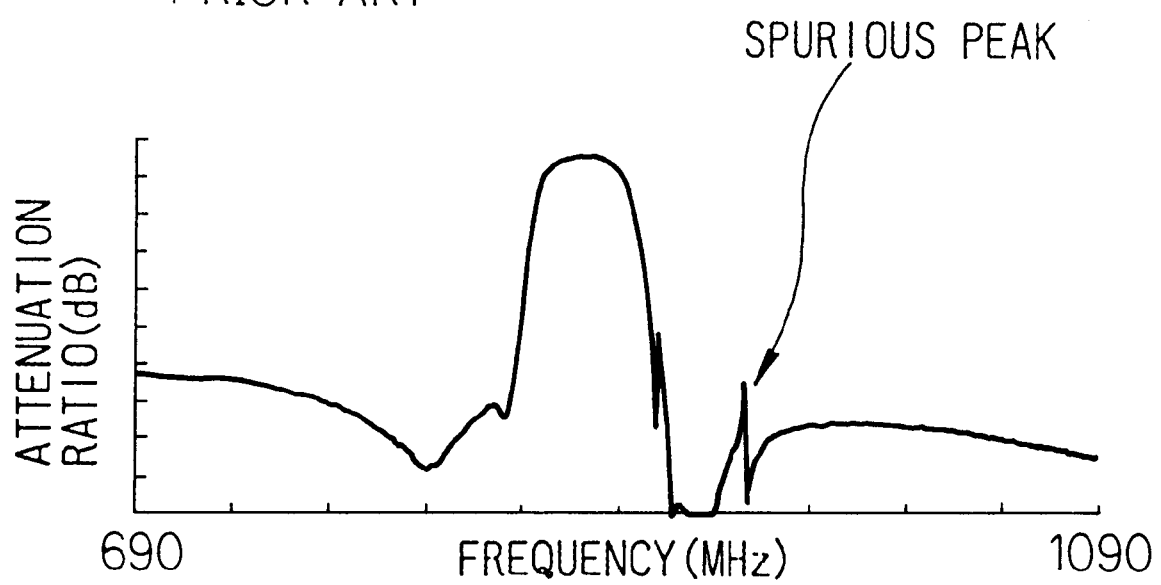
FIG. 4 shows occurrence of a spurious signal in a conventional resonator-type SAW filter.

As previously described, in a conventional resonator-type SAW filter, a spike or what is referred to as a spurious peak occurs at a certain frequency outside a passband because of the structure of the filter. The spurious peak causes the stop-band suppressibility to drop or the attenuation ratio to rise like a spike. FIG. 4 shows occurrence of a spurious peak caused by a conventional resonator-type SAW filter. The spike in FIG. 4 is a spurious peak. As illustrated, an attenuation ratio does not decrease very much at the frequency of the spurious peak. In equipment using the resonator-type SAW filter, when the frequency of the spurious peak corresponds to a frequency that must be suppressed, the suppressibility deteriorates by a degree corresponding to the height of the spurious peak.

Figure 5:
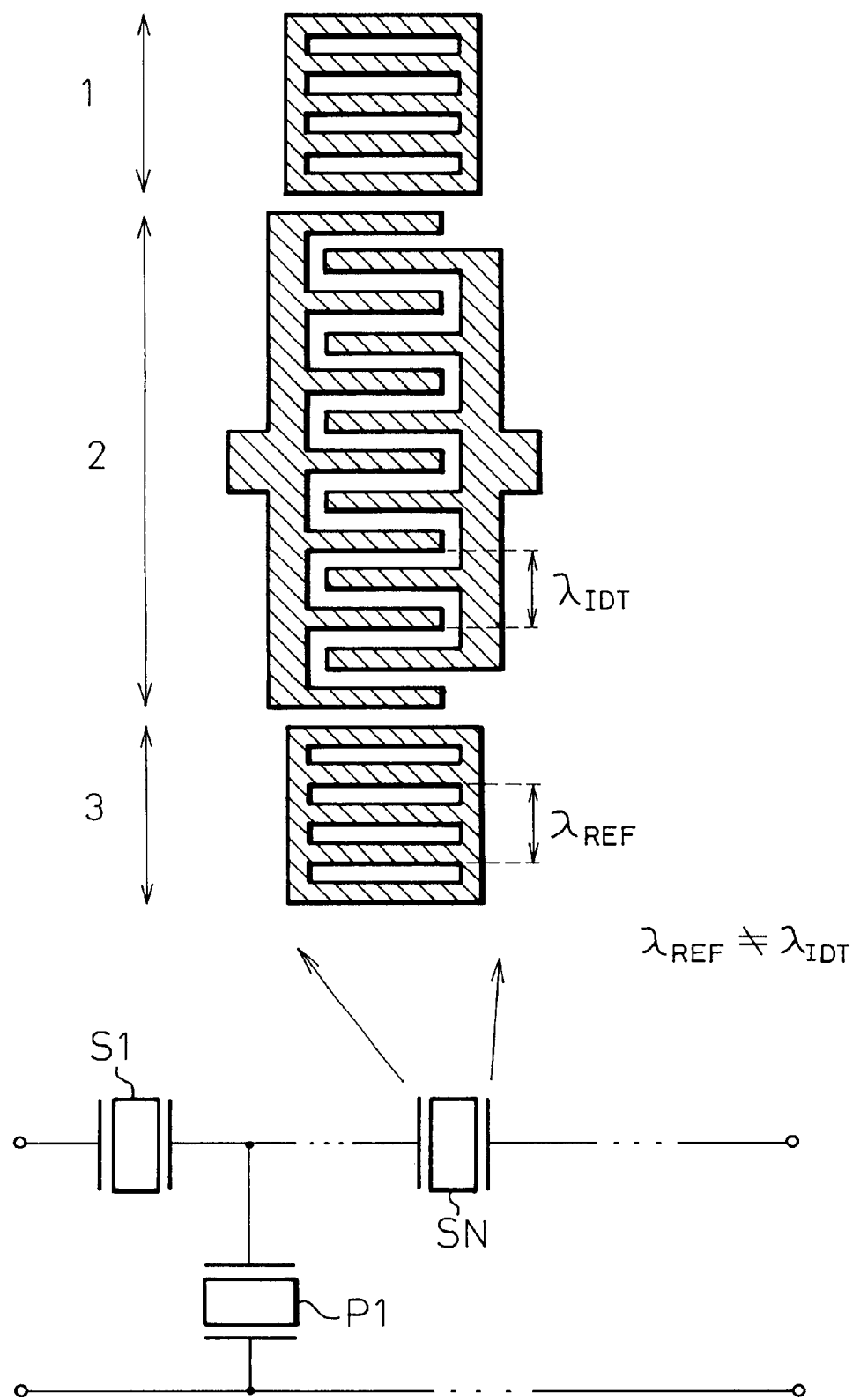
FIG. 5 shows a principle and a structure of a resonator-type SAW filter according to the present invention.

FIG. 5 is a diagram showing a principle and a structure of a resonator-type SAW filter according to the present invention. As shown in FIG. 5, in a resonator-type SAW filter according to the present invention, a plurality of SAW resonators, each having a pair of terminals as well as reflectors 1 and 3 and an IDT 2, are connected in series and parallel with one another. In at least one of the SAW resonators each having a pair of terminals and being connected in series with the other, an inter-electrode pitch $\lambda_{SREF}$ in the reflectors 1 and 3 has a different value from an inter-electrode pitch $\lambda_{SIDT}$ in the IDTs 2.

As shown in FIGS. 3A to 3C, the resonator-type SAW filter is available in various connection arrangements. The present invention can apply to all of the arrangements. Embodiments in which the present invention is applied to the SPSSP arrangement shown in FIG. 3A will be described.

Figure 6:
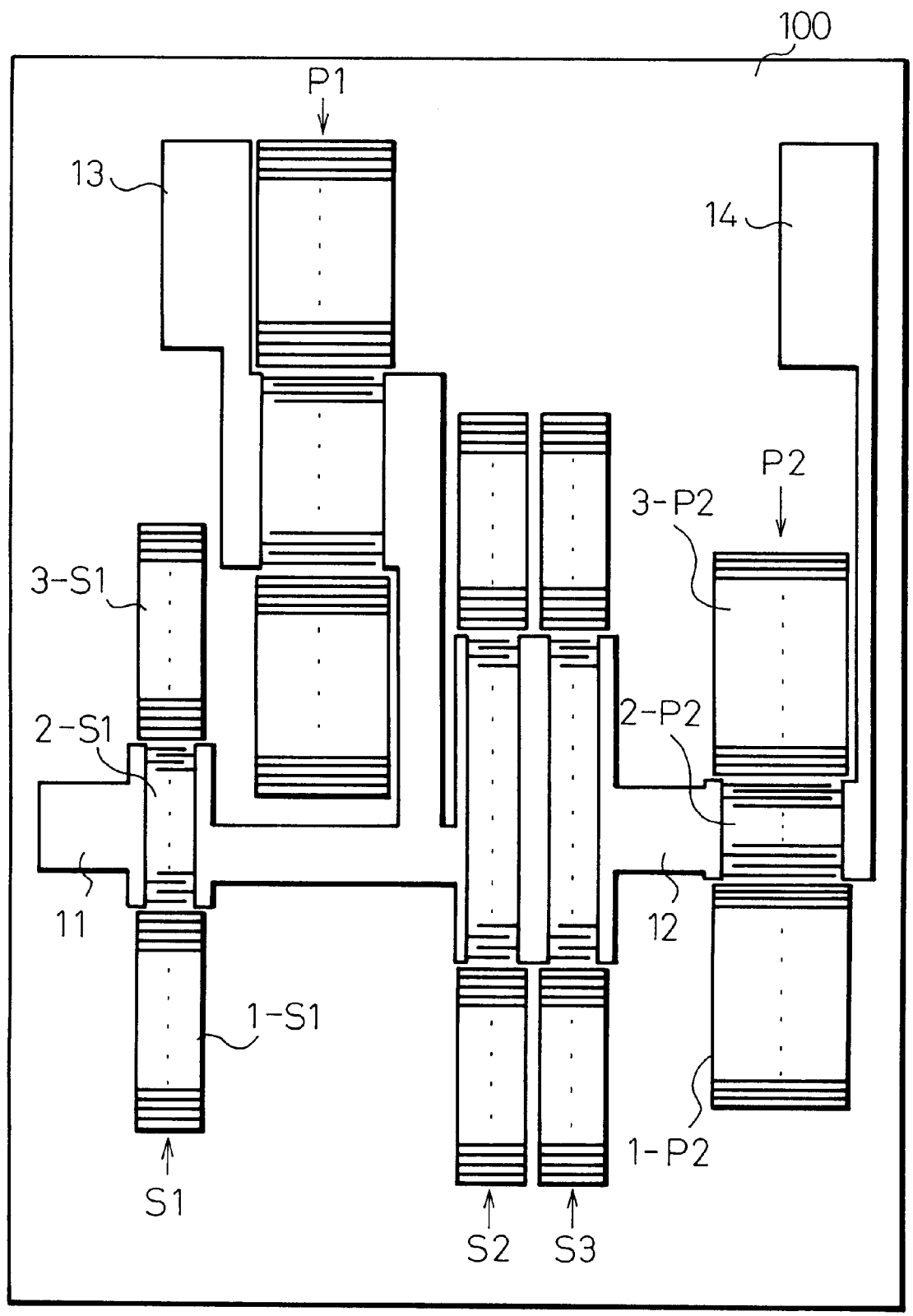
FIG. 6 is a top view showing an overall arrangement of an SPSSP-style resonator-type SAW filter common to every embodiment of the present invention.

FIG. 6 is a top view of a resonator-type SAW filter of the embodiment of the present invention.

In FIG. 6, reference 100 denotes a piezoelectric substrate on which elements to be described below are mounted; 11 denotes an input pad; 12 denotes an output pad; 13 and 14 denote ground pads; and S1, S2, and S3 denote SAW resonators each having a pair of terminals connected in series with one another; P1 and P2 denote SAW resonators each having a pair of terminals and being connected in parallel with the other. In this embodiment, the substrate 100 is a 36° Y-X lithium tantalate (LiTaO$_3$) substrate in which a surface acoustic wave signal propagates in X direction. The electrodes are made of sputtered aluminum film. This arrangement produces an SPSSP resonator-type SAW filter shown in FIG. 3A. Each SAW resonator having a pair of terminals comprises two reflectors and an IDT interposed between the reflectors. For example, the first SAW resonator S1 having a pair of terminals and being connected in series with the other is composed of reflectors 1-S1 and 3-S1 located on both sides and an IDT 2-S1 located in the center. The electrode patterns of the reflectors and IDT are, for example, as shown in FIG. 5.

Figure 7:
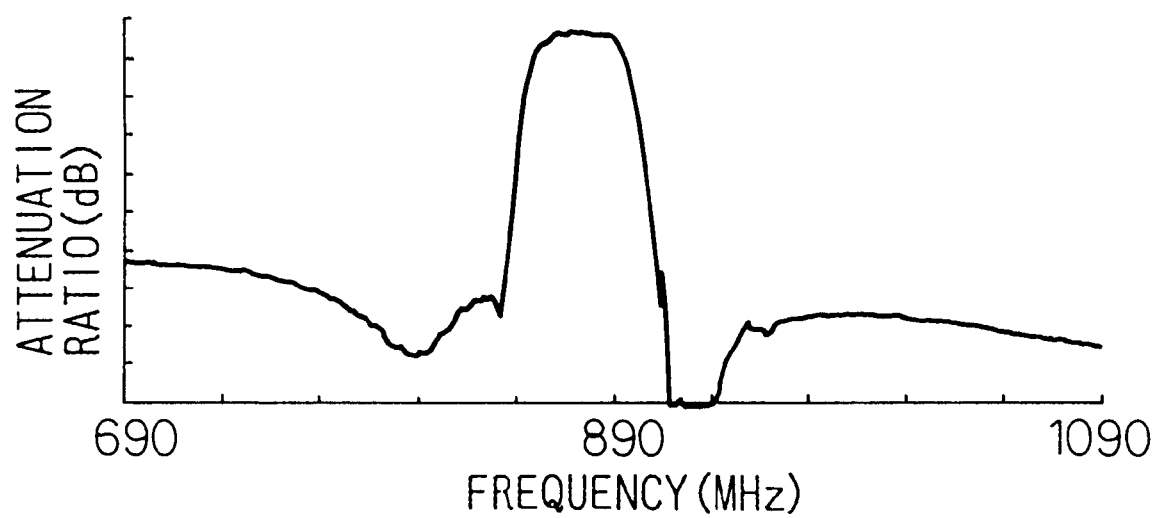
FIG. 7 shows the pass characteristic in the first embodiment.

The first embodiment is a resonator-type SAW filter that is a band-pass filter whose passband ranges from 850 to 900 MHz. In a conventional resonator-type SAW filter, an inter-electrode pitch $\lambda_{SREF}$ in reflectors in SAW resonators each having a pair of terminals and being connected in series with the other, an inter-electrode pitch $\lambda_{SIDT}$ in IDTs therein, an inter-electrode pitch $\lambda_{PREF}$ in reflectors in SAW resonators each having a pair of terminals and being connected in parallel with the other, and an inter-electrode pitch $\lambda_{PIDT}$ in IDTs therein are set to 4.42 micrometers. The pass characteristic of the conventional resonator-type SAW filter is plotted as a graph shown in FIG. 4. In contrast, in the resonator-type SAW filter of this embodiment, only the inter-electrode pitch $\lambda_{SREF}$ in the reflectors in the three SAW resonators, each having a pair of terminals and being connected in series with the other, is set to 4.38 micrometers. FIG. 7 shows the passing characteristic of the resonator-type SAW filter of this embodiment.

As apparent from comparison between FIGS. 7 and 4, the characteristic graph of the resonator-type SAW filter of this embodiment shows the same curves at the frequencies in a passband and the suppressed frequencies as those the characteristic graph of the conventional filter does, but does not include a sharply rising spurious peak which is seen in the characteristic of the conventional filter. The absolute attenuation ratio at the frequency of the spurious peak is about 39 dB which is about 7 dB more than that of the conventional filter.

Figure 8A:
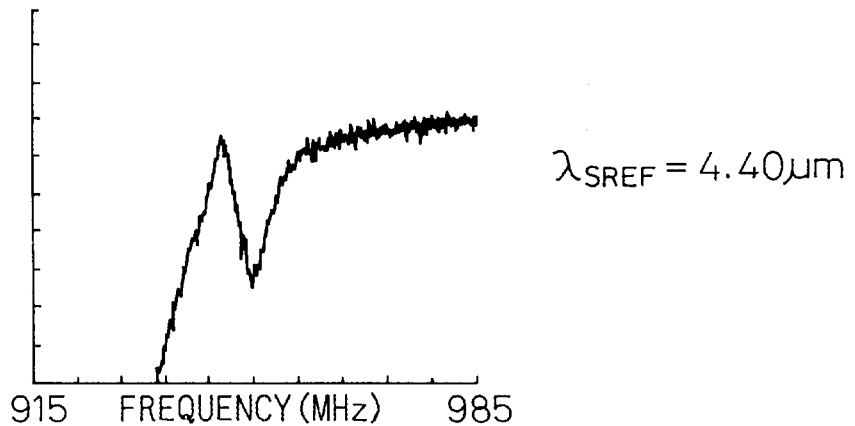
FIGS. 8A to 8C show the pass characteristic at and around a frequency causing a spurious signal in the second embodiment.
Figure 8B:
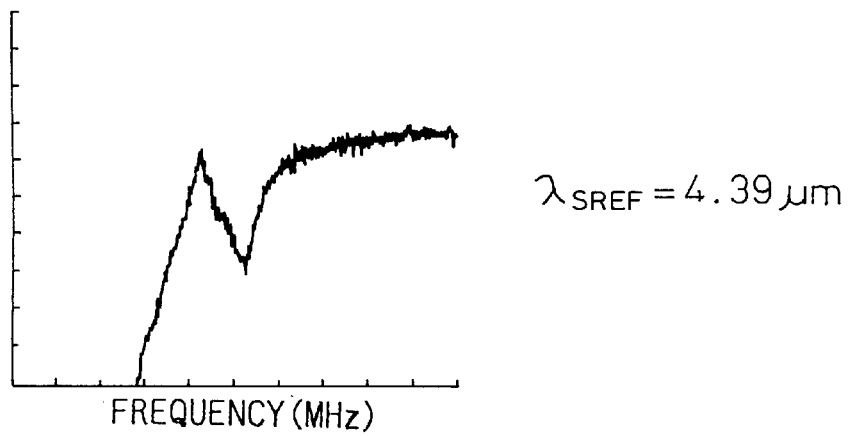
Figure 8C:
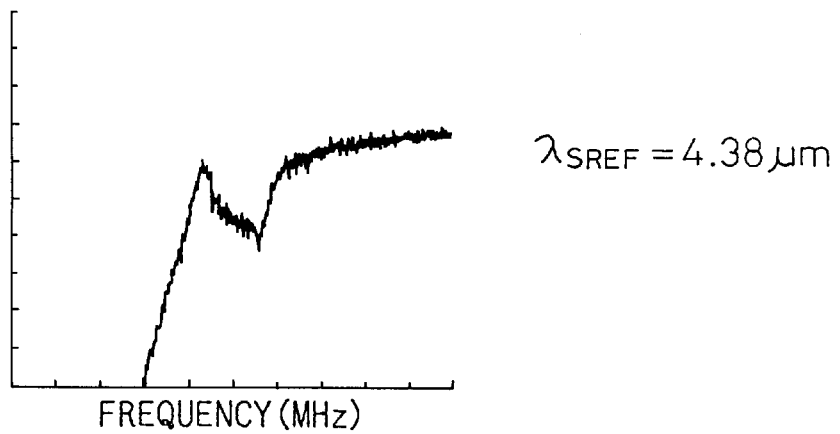

According to the second embodiment, in the SPSSP-style resonator-type resonator shown in FIG. 6, the inter-electrode pitch $\lambda_{PREF}$ in the reflectors in two SAW resonators each having a pair of terminals and being connected in parallel with the other, and the inter-electrode pitch $\lambda_{PIDT}$ in IDTs therein are set to 4.60 micrometers. The inter-electrode pitch $\lambda_{SIDT}$ in IDTs in SAW resonators each having a pair of terminals and being connected in series with the other is set to 4.42 micrometers, and the inter-electrode pitch $\lambda_{SREF}$ in reflectors therein is set to gradually-decreasing values; 4.40, 4.39, and 4.38 micrometers. FIGS. 8A to 8C show a change in the spurious peak resulting from the gradual decrease in $\lambda_{SREF}$ value. FIG. 8A shows a spurious peak occurring when the $\lambda_{SREF}$ value is 4.40 micrometers. FIG. 8B shows a spurious peak occurring when the $\lambda_{SREF}$ value is 4.39 micrometers. FIG. 8C shows a spurious peak occurring when the $\lambda_{SREF}$ value is 4.38 micrometers. FIGS. 8A to 8C are enlarged views of part of FIG. 7 corresponding to a limited frequency range, thus showing the change in the spurious peak more accurately.

As apparent from FIGS. 8A to 8C, the larger the difference between the inter-electrode pitch $\lambda_{SIDT}$ in IDTs in SAW resonators each having a pair of terminals and being connected in series with the other and the inter-electrode pitch $\lambda_{SREF}$ in reflectors therein is, the more successfully the signal height of a spurious peak is reduced.

The first and second embodiments have been described so far. Next, mention will be made of a change in the pass characteristic of a resonator-type SAW filter in which an inter-electrode pitch in IDTs in SAW resonators is set to a different value from an inter-electrode pitch in reflectors therein. The change in pass characteristic has been revealed by another experimental study.

Figure 9A:
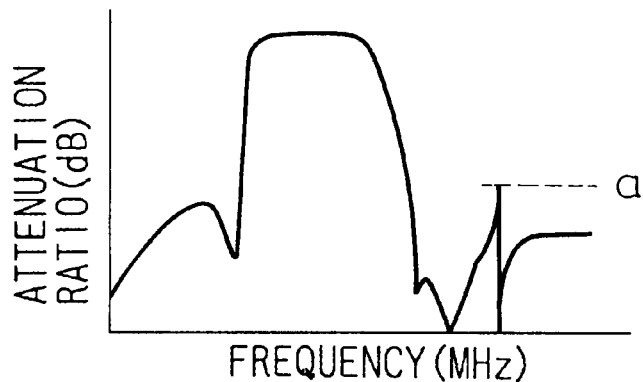
FIGS. 9A to 9C schematically show a general change in the pass characteristic resulting from a variation of a pitch between adjoining electrodes.
Figure 9B:
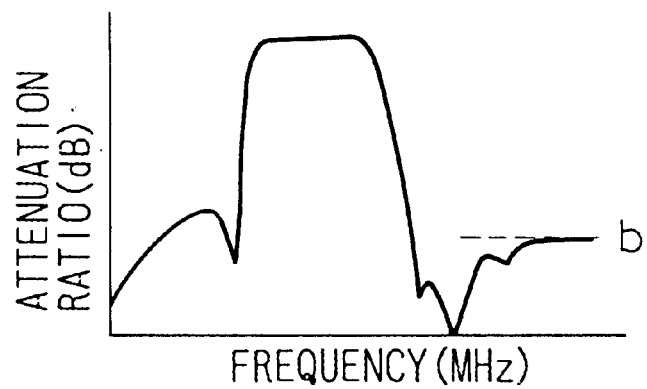
Figure 9C:
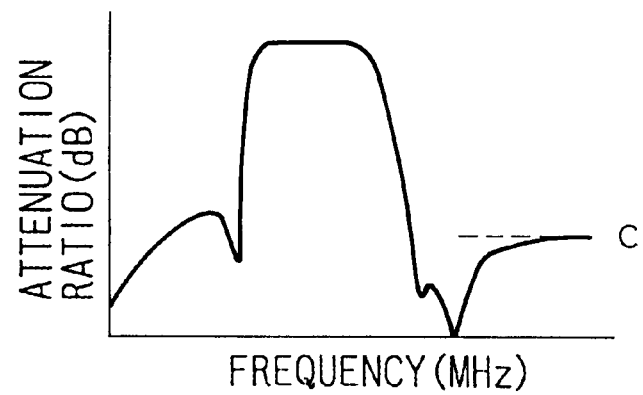

FIGS. 9A to 9C schematically show a general change in the pass characteristic of a resonator-type SAW filter in which the inter-electrode pitch $\lambda_{SREF}$ in reflectors in SAW resonators each having a pair of terminals and being connected in series with the other is varied relative to the inter-electrode pitch $\lambda_{SIDT}$ in IDTs therein. FIG. 9A shows the pass characteristic of a conventional resonator-type SAW filter in which the $\lambda_{SREF}$ value is equal to the $\lambda_{SIDT}$ value. FIG. 9A shows occurrence of a sharp spurious peak at a frequency higher than the passband. The suppressibility of this frequency is as low as a level indicated at a.

This means that satisfactory suppression is not attained at a frequency outside the passband. In the conventional resonator-type SAW filter, therefore, the number of or the combination of SAW resonators to be connected in series and parallel with one another is increased or modified on the assumption that the spurious peak may occur. Thus, the extra-passband suppressibility is improved.

FIG. 9B shows the passing characteristic of a resonator-type SAW filter of the present invention in which the $\lambda_{SREF}$ value is different from the $\lambda_{SIDT}$ value. Unlike FIG. 9A, FIG. 9B does not show occurrence of a sharp spurious peak. When the $\lambda_{SREF}$ value is larger or smaller than the $\lambda_{SIDT}$ value, the signal height of a spurious signal is reduced. Thus, when the $\lambda_{SREF}$ value is different from the $\lambda_{SIDT}$ value, the attenuation ratio for the frequency band increases to provide high extra-passband suppressibility.

As described previously, when the inter-electrode pitch $\lambda_{PREF}$ in the reflectors 1 and 3 in SAW resonators each having a pair of terminals and being connected in parallel with the other is set to a different value from the inter-electrode pitch $\lambda_{PIDT}$ in the IDTs 2 therein, it becomes almost impossible to provide the desired frequency characteristics. In general, it is more practical to make the $\lambda_{SREF}$ value different from the $\lambda_{SIDT}$ value in SAW resonators connected in series with one another. Even when the $\lambda_{PREF}$ value is different from the $\lambda_{PIDT}$ value in SAW resonators connected in parallel with one another, if given conditions are satisfied, occurrence of a spurious signal is found to be minimized without greatly affecting other frequency characteristics. The conditions are such that the $\lambda_{SREF}$ value is larger than the $\lambda_{SIDT}$ value in all SAW resonators connected in series with one another, the $\lambda_{PREF}$ value is smaller than the $\lambda_{PIDT}$ value in all SAW resonators connected in parallel with one another, and the $\lambda_{SREF}$ value is equal to the $\lambda_{PREF}$ value. FIG. 9C shows the passing characteristic of the resonator-type SAW filter under the above conditions. As seen from FIG. 9C, a spurious signal does not occur. The suppression characteristic for the frequency is smoother than that in FIG. 9B. Nevertheless, the overall suppressibility is almost the same as that in FIG. 9B.

Figure 10A:
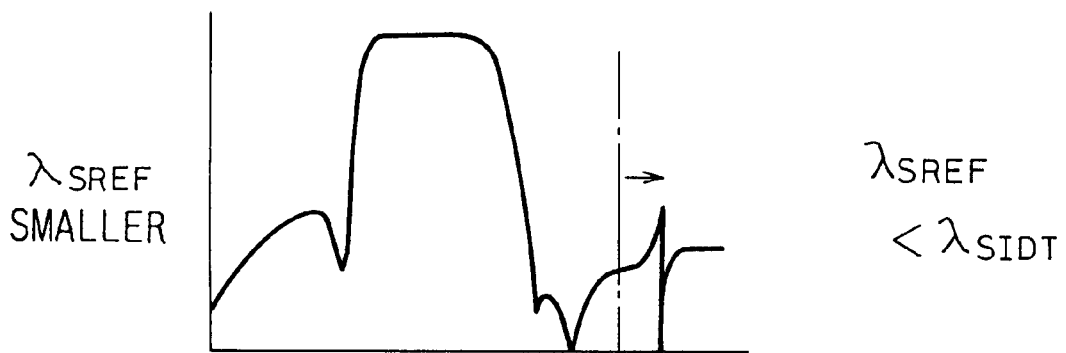
FIGS. 10A to 10C schematically show a change in frequency causing a spurious signal which results from a variation of a pitch between adjoining electrodes.
Figure 10B:
Figure 10C:
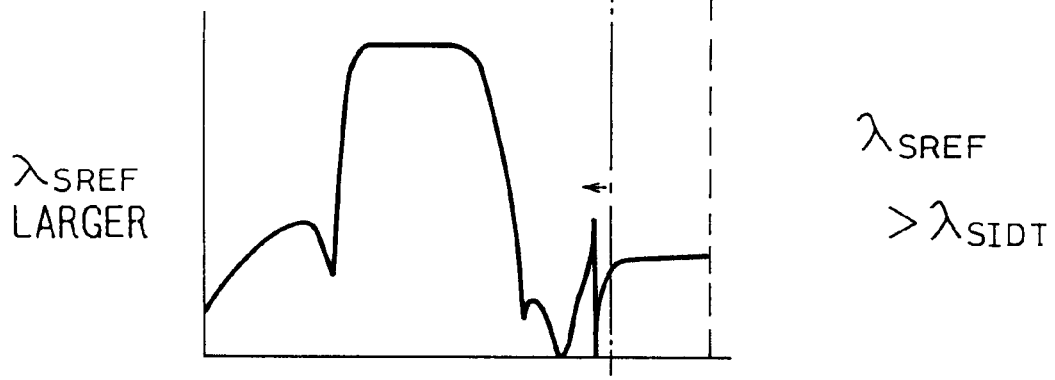

Next, mention will be made of a change in frequency causing a spurious signal which occurs when the inter-electrode pitch $\lambda_{SREF}$ in reflectors in SAW resonators each having a pair of terminals and being connected in series with the other is varied relative to the inter-electrode pitch $\lambda_{SIDT}$ in IDTs therein. FIGS. 10A to 10C schematically show the change. In FIG. 10A, the $\lambda_{SREF}$ value is smaller than the $\lambda_{SIDT}$ value. In FIG. 10B, the $\lambda_{SREF}$ value is equal to the $\lambda^{SIDT}$ value. In FIG. 10C, the $\lambda_{SREF}$ value is larger than the $\lambda_{SIDT}$ value. As described above, when the $\lambda_{SREF}$ value differs from the $\lambda_{SIDT}$ value, the signal height of a spurious signal is reduced. For description's sake, the graphs are plotted to indicate occurrence of a spurious signal even when the $\lambda_{A\ SREF}$ value differs from the $\lambda_{SIDT}$ value.

Compared with the frequency causing a spurious signal when the $\lambda_{SREF}$ value is, as shown in FIG. 10B, equal to the $\lambda_{SIDT}$ value, the frequency becomes higher when the $\lambda_{SREF}$ value is smaller than the $\lambda_{SIDT}$ value. The frequency becomes lower when the $\lambda_{SREF}$ value is larger than the $\lambda_{SIDT}$ value. Occurrence of a spurious signal at a frequency to be suppressed can therefore be prevented by specifying an appropriate value as the $\lambda_{SREF}$ value relative to the $\lambda_{SIDT}$ value.

A range in which the $\lambda_{SREF}$ value can be varied relative to the $\lambda_{SIDT}$ value without greatly affecting other frequency characteristics except the characteristic concerning occurrence of a spurious signal, is a range satisfying such a condition as $0.98 \times \lambda^{SIDT} < \lambda_{SREF} < \lambda^{SIDT}$, wherein the $\lambda_{SREF}$ value is smaller than the $\lambda^{SIDT}$ value. When the $\lambda_{SREF}$ value is larger than the $\lambda^{SIDT}$ value, the range meets such a condition as $\lambda_{SIDT} < \lambda_{SREF} < 1.04 \times \lambda_{SIDT}$.

As described so far, according to the present invention, the stop-band suppressibility can be markedly improved by reducing the signal height of a spurious signal. Moreover, a frequency causing a spurious signal can be changed arbitrarily to some extent. It is therefore possible to provide high stop-band suppressibility at a frequency inherent to equipment employed. The improvement of stop-band suppressibility according to the present invention hardly affects the conventional pass characteristic. Conventional technologies including a design technology can therefore be utilized as they are. A resonator-type SAW filter according to the present invention can be materialized with little effort.

What is claimed is:

1. A resonator-type surface-acoustic wave (SAW) filter comprising:
    a plurality of SAW resonators connected in series and parallel with each other, each SAW resonator has a pair of terminals as well as reflectors having electrodes and an interdigital transducer having interdigital electrodes, wherein:
        in at least one of said SAW resonators connected in series with another of said SAW resonators, a pitch between adjoining electrodes, which is referred to as an inter-electrode pitch $\lambda_{SREF}$ in said reflectors is different from a pitch between adjoining interdigital electrodes, which is referred to as an inter-electrode pitch $\lambda_{SIDT}$ in said interdigital transducers; and
        in each of said SAW resonators connected in parallel, a pitch between adjoining electrodes in said reflectors is the same as a pitch between adjoining interdigital electrodes in said interdigital transducers.

2. A resonator-type SAW filter according to claim 1, wherein in said SAW resonators in which said $\lambda_{SREF}$ and said $\lambda_{SIDT}$ are different, said $\lambda_{SREF}$ is larger than said $\lambda_{SIDT}$.

3. A resonator-type SAW filter according to claim 1, wherein in said SAW resonators in which said $\lambda_{SREF}$ and said $\lambda_{SIDT}$ are different, said $\lambda_{SREF}$ is shorter than said $\lambda_{SIDT}$.

4. A resonator-type SAW filter according to claim 3, wherein said $\lambda_{SREF}$ and said $\lambda_{SIDT}$ have a relationship as follows:

$0.98 * \lambda_{SIDT} < \lambda_{SREF} < \lambda_{SIDT}$.

5. A resonator-type SAW filter according to claim 3, wherein said $\lambda_{SREF}$ and said $\lambda_{SIDT}$ have a relationship as follows:

$\lambda_{SIDT} < \lambda_{SREF} < 1.04 * \lambda_{SIDT}$.

6. A resonator-type surface-acoustic-wave (SAW) filter comprising:
    a plurality of SAW resonators connected in series and parallel with each other, each SAW resonator has a pair of terminals as well as reflectors having electrodes and an interdigital transducer having interdigital electrodes, wherein:
        in each of said SAW resonators connected in series, a pitch between adjoining electrodes, which is referred to as an inter-electrode pitch $\lambda_{SREF}$, in said reflectors is different from a pitch between adjoining interdigital electrodes, which is referred to as an inter-electrode pitch $\lambda_{SIDT}$, in said interdigital transducers;

in each of said SAW resonators connected in parallel, a pitch between adjoining electrodes, which is referred to as an inter-electrode pitch $\lambda_{PREF}$, in said reflectors is different from a pitch between adjoining interdigital electrodes, which is referred to as an inter-electrode pitch $\lambda_{PIDT}$ in said interdigital transducers; and said $\lambda_{SREF}$, $\lambda_{SIDT}$, $\lambda_{PREF}$ and $\lambda_{PIDT}$ have a relationship as follows:

$\lambda_{SIDT} < \lambda_{SREF} = \lambda_{PREF} < \lambda_{PIDT}$.

\* \* \* \* \*